US005748014A

United States Patent [19]
Bayer

[11] Patent Number: 5,748,014
[45] Date of Patent: May 5, 1998

[54] EDGE DETECTOR

[75] Inventor: Erich Bayer, Ergolding, Germany

[73] Assignee: Texas Instruments Deutschland GmbH, Freising, Germany

[21] Appl. No.: 475,444

[22] Filed: Jun. 7, 1995

[30] Foreign Application Priority Data

Mar. 31, 1995 [EP]  European Pat. Off. ............ 95104827

[51] Int. Cl.$^6$ ............................................... H03K 5/153
[52] U.S. Cl. ............................................. 327/72; 327/205
[58] Field of Search ............................... 327/14, 15, 16, 327/18, 23, 24, 72, 73, 205

[56] References Cited

U.S. PATENT DOCUMENTS

| | | | |
|---|---|---|---|
| 3,838,448 | 9/1974 | Garde et al. | 360/45 |
| 4,571,547 | 2/1986 | Day | 328/116 |
| 4,585,952 | 4/1986 | Yamamoto | 307/268 |
| 5,404,054 | 4/1995 | Kotowski | 327/205 |

FOREIGN PATENT DOCUMENTS

A-2120 030  11/1983  United Kingdom ............ H03K 5/08

*Primary Examiner*—Timothy P. Callahan
*Assistant Examiner*—Jeffrey Zweizig
*Attorney, Agent, or Firm*—David S. Guttman; William E. Hiller; Richard L. Donaldson

[57] ABSTRACT

An edge detector for producing output signals in a manner dependent on positive and/or negative edges of an input signal comprises a control circuit (10), by which a reference signal level ($V_{ref}$) available at a storage element (C) may be continuously assimilated at a predeterminable first level change rate ($PG_1$) to the input voltage level ($V_E$). It moreover includes at least one comparison circuit (12), which supplies an output signal ($V_A$, $V_A'$) indicative of the occurrence of an edge, when the input voltage level ($V_E$) changes by at least a predeterminable relative threshold value ($U_{off}$) in relation to the reference voltage level ($V_{ref}$). The control circuit (10) comprises a delay means (14) whose delay time ($\Delta t_D$) causing a delay in the assimilation of the reference voltage level is selected to be equal to the ratio of the predeterminable relative threshold value ($U_{off}$) to the predeterminable first level change rate ($PG_1$).

11 Claims, 2 Drawing Sheets

EDGE DETECTOR

The invention relates to an edge detector for producing output signals in dependence on positive and/or negative edges of an input signal.

Edge detectors are employed inter alia for the recognition of rising or falling edges of square wave signals, which are transmitted for example via a bus, which serves as a common transmission path for data exchange between two or more connected electronic devices. In such bus systems address, data and/or control signals can be more particularly transmitted. A decisive point for minimum error communication between the individual devices is, inter alia, the ability of the respective devices to reliably recognize the signals to be received.

Accordingly, in a series of known bus systems comparators are utilized by which the received signal is directly compared with a fixed reference signal. However a problem in such conventional bus systems is that a shift, occasioned for example by pick-up, of the ground level may impair or even prevent signal recognition. More particularly, it is impossible to exclude the possibility of the ground level being shifted as far as an area near to the fixed reference signal level. At least in the latter case unequivocal signal recognition is practically out of the question.

Furthermore it is desirable for the reliability of edge recognition to be increased by the application of further criteria such as rise rate or edge steepness. In this respect there may however be problems due to the fact that mutual dependence between the detected rise rate and the threshold voltage can not be excluded. The danger of such a mutual dependence occurs more particularly if the rise rate of the input signal is within the permissible minimum rise rate. At least in this case it is in fact necessary to expect the chance of a change in the respectively employed reference voltage level even during transition of the output signal to the new condition, something which may more especially lead to an erroneous detection of the rise rate of the input signal.

One aim of the invention is consequently to provide an edge detector of the type initially mentioned, which while having the simplest possible circuit design renders possible highly reliable, true signal recognition.

This object is to be attained by the invention using a control circuit, by which a reference signal level available at a storage element may be continuously assimilated at a predeterminable first level change rate to the input voltage level, at least one comparison circuit, which supplies an output signal indicative of the occurrence of an edge, when the input voltage level changes by at least a predeterminable relative threshold value in relation to the reference voltage level and a delay means comprised in the control circuit, whose delay time causing a delay in the assimilation of the reference voltage level is selected to be equal to the ratio of the predeterminable relative threshold value to the predeterminable first level change rate.

Owing to such design a respective edge will always be detected in a reliable manner, if in the case of such a respective change of the input signal its rise rate or edge steepness is larger than the predeterminable permissible minimum raise rate and a predeterminable relative threshold value is exceeded, the permissible minimum rise rate and the relative threshold value being able to be set independently of one another and on the recognition of a respective signal edge are also able to be detected independently of each other, that is to say without any mutual influence on one another. The reference voltage level is continuously adapted with the predeterminable level change rate to the respectively quiescent voltage level of the input signal, the permissible minimum rise rate also being able to be predetermined with this first level change rate simultaneously. A pre-condition for the recognition of a respective edge is accordingly that the rise rate of the input signal is greater than this predeterminable first level change rate. It is only in this case that the relative threshold value may be attained such that, when it is exceeded, an output signal, indicative of the occurrence of the edge, is produced. If on the contrary this relative threshold value is not attained, then no corresponding output signal will be supplied, even if the rise rate of the input signal should be in excess of the permissible minimum rise rate, i. e. greater than the first level change rate. A substantial advantage of the invention is now that owing to the delay means, which is provided in the control circuit serving for reference voltage level adaptation, there is no possibility of a change in the reference voltage level prior to reaching the threshold value and accordingly actual edge recognition even if the rise rate of the input signal is only slightly larger than the permissible minimum rise rate. In this critical case as well there is an exactly defined relative threshold value, i. e. one related to the previous quiescent voltage level. The detected rise rate is always independent from the voltage to be detected. Falsification of the detected value by a shift occurring during a signal change, of the reference voltage level and accordingly of the relative threshold value is out of the question. Conversely the relative threshold value to be exceeded for edge recognition is independent from the respective rise rate of the input signal and in any case is exactly set by the predeterminable value.

In accordance with a further development of the invention the control circuit comprising the delay means and the storage element, furthermore possesses a first charge and discharge circuit associated with the storage element and a first comparator, to whose one input the reference voltage level is applied and to whose other input the reference voltage level is applied, the input of the firstly comparator being connected via the delay means with a control output of the first charge and discharge circuit. In this case the delay means causes the adaptation, occurring via the first charge and discharge circuit of the reference voltage level to the respective quiescent voltage level of the input signal to be controlled with a delay equal to the defined delay time, which is equal to the ratio of the predeterminable relative threshold value to the predeterminable first level change rate.

If, as is convenient, the storage element is a capacitor, then the first charge and discharge circuit may include a first current source pair in order to produce a first charge or, respectively, discharge flow, whose value will determine, together with the capacitance of the capacitor, the predeterminable first level change rate. The first level change rate may consequently be preset using the charge or, respectively, discharge current and/or the capacitance of the capacitor just as may be desired.

The storage element may with advantage have a second charge and discharge circuit associated with it, which comprises a control input, to which the output signal of the comparison circuit is applied in order to adapt the reference voltage level, which can be taken from the storage element, in a manner dependent on the occurrence of the output signal with a predeterminable second level change rate, to the input voltage level decreased by the predeterminable relative threshold value, the predeterminable second level change rate being larger than the first one. It is preferred for this second level change rate to be substantially, and preferably many times, greater than the first one so that for example immediately after the occurrence of an output signal indicative of a respective edge, the reference voltage level is assimilated as fast as possible, that is to say matched to the input voltage level decreased by the predeterminable relative threshold value. For edge recognition it is in fact quite sufficient if the predeterminable threshold value is exceeded, given a sufficient rise rate. This form of the invention means that the respective recovery times may be substantially shortened.

Further advantageous forms of the invention are recited in the dependent claims.

The invention will now be described with reference to working embodiments as depicted in the drawings in more detail.

Figure 1:
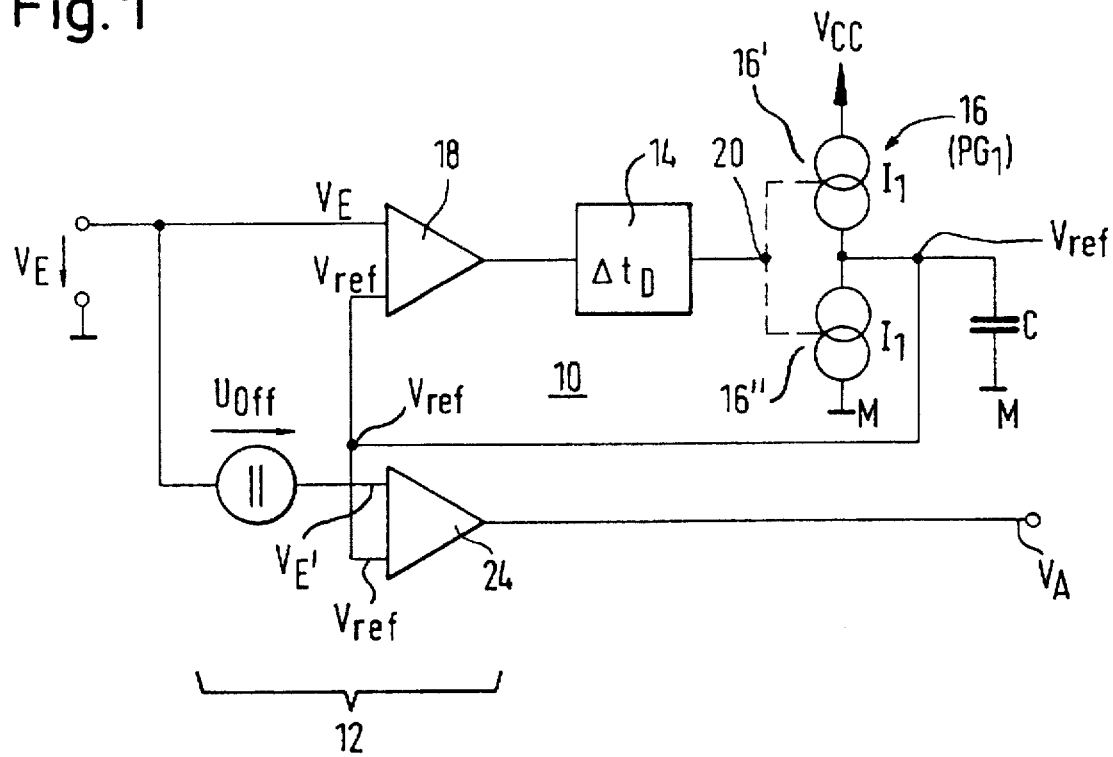
FIG. 1 shows a diagrammatic view of a first working embodiment of an edge detector.

The edge detector diagrammatically illustrated in FIG. 1 generally serves for the production of output signals in a manner dependent on the positive and/or negative edges of an input signal.

It comprises a control or regulation circuit 10, by which a reference voltage level $V_{ref}$ is continuously assimilated at a predeterminable first level change rate $PG_1$ to the input voltage level $V_E$. The reference voltage level $V_{ref}$ is taken from a capacitor C connected at one end with ground M and serving as a storage element.

Besides the capacitor C the control circuit 10 includes a first charge and discharge circuit 16, a first comparator 18 and a delay means 14 placed between the output of the comparator 18 and a control input 20 of the first charge and discharge circuit 16. .

The first charge and discharge circuit 16 comprises a first current source pair 16' and 16", whose current sources are able to be driven oppositely via the control input 20 of the charge and discharge circuit 16 in order to produce a first charge and/or discharge current $I_1$, whose constant value, together with the capacitance of the capacitor C will set the first level change rate $PG_1$. In this respect the side, which is opposite to the ground side, and has the reference voltage level $V_{ref}$, of the capacitor C is connected with the node between the two current sources of the current source pair 16' and 16". One current source 16' is connected with the supply voltage $V_{cc}$, whereas the other current source 16" is connected with ground M. The capacitor C is hence charged via the current source 16' connected with the supply voltage $V_{cc}$ and discharged via the current source 16" connected with ground M.

One input of the first comparator 18 receives the input voltage level $V_E$. The other input o this comparator 18 is connected with the side, opposite to the ground side, of the capacitor C and is accordingly acted upon by the reference voltage level $V_{ref}$.

The first charge and discharge circuit 16 is consequently driven via the delay member 14 by the first comparator 18 in a manner dependent on the result of the comparison between the input voltage level $V_E$ and the reference voltage level $V_{ref}$, it being possible to ensure via the control circuit 10 that the reference voltage level $V_{ref}$ is assimilated, retarded by the delay means 14, by $\Delta t_D$ at the predeterminable first level change rate $PG_1$, to the input voltage level $V_E$.

The edge detector furthermore includes a comparison circuit 12 with a second comparator 24, whose one input is connected with the voltage level $V_E'$, which is equal to the input voltage level $V_E$ decreased by a predeterminable relative threshold value $U_{off}$ and at whose other input the reference voltage level $V_{ref}$ is present. The predeterminable relative threshold value $U_{off}$ may for instance be produced by a direct voltage source, which is connected between the respective input of the second comparator 24 and the input, at the input voltage level $V_E$, of the edge detector. The reference voltage level $V_{ref}$ is for its part taken from the capacitor C so that both an input of the first comparator 18 and also an input of the second comparator 24 is connected with the respective side of the capacitor C.

The second comparator 24 associated with the comparison circuit 12 accordingly supplies at its output an output signal $V_A$ indicative of the occurrence of an edge, when the input voltage level $V_E$ changes by at least the predeterminable relative threshold value $U_{off}$ in relation to the reference voltage level $V_{ref}$.

The predeterminable first level change rate $PG_1$, with which the reference voltage level $V_{ref}$ is continuously adapted to the input voltage level $V_E$, is determined by the value of the first charge and discharge current $I_1$, and the capacitance of the capacitor C, i. e. by the following equation:

$$PG_1 = \Delta U_c / \Delta t = I_1 / C. \tag{1}$$

This first level change rate $PG_1$ able to be predetermined as desired using $I_1$, and C, simultaneously sets the permissible minimum rise rate, which the input signal must have for edge recognition. The relative threshold value $U_{off}$ able to be predetermined for example using a direct voltage source, may only be reached or, respectively, exceeded, if the rise rate of the input signal is equal to or larger than this predeterminable first level change rate $PG_1$. Otherwise the voltage level $V_E'$ at the one input of the second comparator 24 will remain below the reference voltage level $V_{ref}$ so that in this case the comparator 24 does not supply any output signal $V_A$ indicative of the occurrence of a respective edge. If the rise rate input signal is on the contrary larger than the predeterminable first level change rate $PG_1$, and if the threshold value $U_{off}$ is exceeded then there will be a positive differential signal at the two inputs of the second comparator 24, following which an output signal $V_A$ indicative of the respective edge will be supplied.

The delay $\Delta t_D$ set by the delay means 14 in the control circuit 10 is selected to be equal to the ratio between the predeterminable relative threshold value $U_{off}$ and the predeterminable first level change rate $PG_1$. It may accordingly be derived with the following equation:

$$\Delta t_D = U_{off} / PG_1 = U_{off} \cdot C / I_1 \tag{2}$$

Such delay time $\Delta t_D$ introduced into the control circuit 10 by the delay means 14 is accordingly so selected that a change in the reference voltage level prior to attaining the threshold value and accordingly prior to actual edge detection will certainly be impossible even if the rise rate is only slightly larger than the permissible minimum rise rate set by the first level change rate $PG_1$. In this critical case as well there will be an exactly defined threshold value, which is relative, that is to say related to the previous quiescent voltage level. The threshold value which is actually to be exceeded on the basis of the previous quiescent voltage level, is therefore independent of the respective rise rate of the input signal. The permissible minimum rise rate and the relative threshold value, which must be exceeded for edge recognition, are able to be predetermined independently of each other and on recognition of the respective signal edge may also be detected independently of each other, that is to say without any mutual effect on each other.

The manner of operation of the working embodiment depicted in FIG. 1 is as follows:

The control circuit 10 assimilates the reference voltage level $V_{ref}$ at the first level change rate $PG_1$ able to be predetermined using the charge and discharge circuit 16 with a delay $\Delta t_D$ to the input voltage level $V_E$. At the relatively slow first level change rate $PG_1$, there is accordingly a continuous adaptation of the reference voltage level $V_{ref}$ to the respective quiescent voltage level of the input signal. At this first level change rate $PG_1$ simultaneously the permissible minimum rise rate is set as well, which must be exceeded for edge recognition.

If the rise or, respectively, change rate of the input signal is less than the first level change rate $PG_1$, the reference voltage level $V_{ref}$ may follow the input voltage level $V_E$. The threshold value $U_{off}$ will in this case not be reached so that at the output of the second comparator 24 there is also no output signal $V_A$ indicative of the occurrence of an edge. In the static state, i. e. with a constant input voltage level $V_E$ (D.C. state) the control circuit 10 will cause the differential voltage present between the inputs of the first comparator 18 to be zero, i. e. the reference voltage level $V_{ref}$ is equal to the input voltage level $V_E$.

If on the contrary the input signal changes with a rise rate, which is greater than the predeterminable first level change rate $PG_1$, it is possible, owing to the slower follow-up of the reference voltage level, for the input voltage level $V_E$ to change to an increasing extent in relation to such reference voltage level $V_{ref}$. This is a pre-condition for any voltage differential, as necessary for edge recognition, occurring between the input voltage level $V_E$ and the reference voltage level $V_{ref}$. If in the further course of the change in the input voltage level $V_E$ in relation to the reference voltage level $V_{ref}$ corresponding to the previous quiescent voltage level of the input signal, the threshold value $U_{off}$ is exceeded, the voltage level $V_E'$ present at one input of the second comparator 24 will be larger than the reference voltage level present at the other input of this comparator 24, following which an input signal $V_A$ indicative of the respective edge will be supplied at the output of the comparator 24.

Owing to the delay means 14 the first charge and discharge circuit 16 is at all times driven with a delay of $\Delta t_D$ by the output signal of the first comparator 18 so that matching or assimilation of the reference voltage level $V_{ref}$ to the input voltage level $V_E$ is correspondingly retarded.

Once this delay time $\Delta t_D$ has been selected to be equal to the ratio between the predeterminable relative threshold value $U_{off}$ and the predeterminable first level change rate $PG_1$ (see the above equation 2), the permissible minimum rise rate able to be predetermined by the first level change rate $PG_1$ and the threshold value $U_{off}$ able to be predetermined for example by a direct voltage source, which must be exceeded for respective edge recognition, are able to be set independently of one another and during signal recognition are able to be detected independently of each other as well, i. e. without having any mutual effect on each other.

The detected rise rate is always independent of the voltage to be detected. Falsification of the detected value by shift of the reference voltage level, occurring during signal change, and accordingly a shift in the relative threshold value is out of the question. Conversely the relative threshold value $U_{off}$ to be exceeded for edge recognition is independent of the respective rise rate of the input signal and in any case is unambiguously determined by one and the same predetermined absolute voltage, produced for example by a direct voltage source. This more particularly applies as well for a critical case in which the rise rate of the input signal is only slightly larger than the first level change rate $PG_1$. Owing to the delay time $\Delta t_D$ selected in the above fashion each change in the input voltage level $V_E$ is followed by an assimilation of the reference voltage level $V_{ref}$ but only when the input voltage level $V_E$ has already reached the threshold value $U_{off}$ assuming a continuous rise that is, i. e. the edge has already been recognized. Since during the transition of the input signal from the previous quiescent voltage level to a value higher by the threshold value $U_{off}$, the reference voltage level $V_{ref}$ will not have changed, the same will still correspond to the previous quiescent voltage level until the issue of the output signal $V_A$ representing the occurrence of the respective edge. The level comparison accordingly takes place in any case in such a manner that the input voltage level $V_E$ is compared with the previously obtaining quiescent voltage level and the respective voltage change is then checked to see whether, in relation to this quiescent voltage level, it has led to a change in accordance with the threshold value $U_{off}$. There is accordingly no possibility of the comparison being performed on the basis of a reference voltage level also changing during the change in the input voltage, instead of on the basis of the obtaining quiescent voltage level, which is alone relevant, of the input voltage.

Even if the rise rate of the input signal is larger than the first level change rate $PG_1$, the assimilation of the reference voltage level $V_{ref}$ to the input voltage level $V_E$ will only take place after the delay time $\Delta t_D$. Owing to the greater rise rate of the input signal the threshold value $U_{off}$ is reached in this case prior to the elapse of the delay time $\Delta t_D$. In this case as well it is possible to ensure that an output signal $V_A$ indicative of the occurrence of an edge is only produced, if the input voltage level $V_E$ has changed by exactly the intended relative threshold value $U_{off}$ in relation to the previous quiescent voltage level. In this case as well the delay time $\Delta t_D$ in fact means that the reference voltage level $V_{ref}$ will not change prior to the threshold value $U_{off}$ being attained.

If on the contrary the rise rate of the input signal remains below the predeterminable first level change rate $PG_1$, then the input voltage level $V_E$ can not, despite the delay time $\Delta t_D$, reach the threshold value $U_{off}$. While, after the occurrence of a respective voltage change at the input, the input voltage level $V_e$ may change in relation to the rotary voltage level $V_{ref}$ owing to the smaller rise rate until the elapse of the delay time $\Delta t_D$ only a differential value will be reached, which is smaller than the predeterminable relative threshold value $U_{off}$. After elapse of the delay time the reference voltage level $V_{ref}$ is then assimilated to the input voltage level $V_E$ at the higher first level change rate $PG_1$ so that the voltage difference present at the second comparator 24 will decrease again. The threshold value $U_{off}$ is accordingly not reached so that the second comparator 24 does not supply the output signal $V_A$ indicative of a respective edge either.

The predeterminable first level change rate $PG_1$ is able to be set by the value of the charge and discharge current $I_1$, of the first charge and discharge circuit 16 and/or the capacitance of the capacitor C (see equation 1). The relative threshold value $U_{off}$ is able to be set independently of the this, for example using a suitable direct voltage source. It is then only necessary to ensure that the delay time $\Delta t_D$ as well is assimilated in accordance with the above equation 2.

Figure 2:
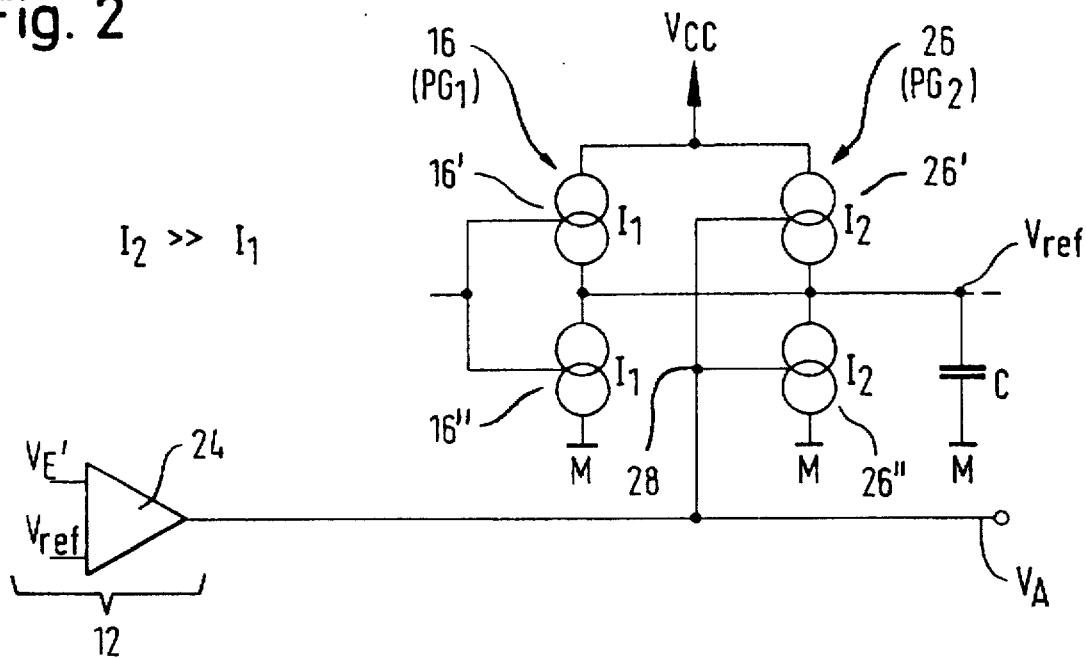
FIG. 2 shows a diagram of a part of a second working embodiment of an edge detector.

FIG. 2 shows a diagrammatic view of part of a second working embodiment of an edge detector, which differs from the detector of FIG. 1 merely in that the capacitor C serving as a storage element has a second charge and discharge circuit 26 associated with it. In other respects such working embodiment is the same as that of FIG. 1 so that like parts are denoted by like reference numerals.

The second charge and discharge circuit 26 possesses a control input 28, which is connected with the output of the second comparator 24 of the comparison circuit 12 and is because of this acted upon by the output signal $V_A$ indicative of the occurrence of a respective edge.

This second charge and discharge circuit 26 serves to assimilate the reference voltage level $V_{ref}$ available at the capacitor C, in a manner dependent on the occurrence of the output signal $V_A$ at a predeterminable second level change rate $PG_2$ to the input voltage level $V_E$ decreased by the predeterminable relative threshold value $U_{off}$ such predeterminable second level change rate $PG_2$ being larger than the first one $PG_1$.

This second charge and discharge circuit 26 may for this purpose comprise a second current source pair 26' and 26" in order to produce a second charge and discharge current $I_2$ whose value, together with the capacitance $V_{off}$ of the capacitor C sets the predeterminable second level change rate $PG_2$. In the illustrated working embodiment of the invention the node between the two current sources of the current source pair 26' and 26" is on the one hand connected with the respective node of the first current source pair 16' and 16" and on the other hand with the side, opposite to the ground side, of the capacitor C. The one current source 26' is for its part connected with the power voltage $V_{cc}$, whereas the other current source 26" is connected with ground M. The second level change rate is defined by the equation:

$$PG_2 = \Delta U_c / \Delta t = I_2 / C \quad (3)$$

wherein $I_2 \gg I_1$.

As soon as an output signal $V_A$ indicative of the occurrence of a respective edge occurs, the reference voltage level $V_{ref}$ is set at such a value that the differential voltage between the inputs of the second comparator 24 (see FIG. 1) becomes zero. The reference voltage level $V_{ref}$ supplied both to one input of the first comparator 18 and also to one input of the second comparator 24 is accordingly changed to the value $V_E$ at the higher second level change rate $PG_2$.

It is appropriate if such second level change rate $PG_2$ is made substantially larger than the first one so that immediately after the occurrence of an output signal $V_A$ indicative of a respective edge, of the reference voltage level $V_{ref}$ is as rapidly as possible caused to follow or, respectively, be assimilated to the input voltage level $V_E$ reduced by the predeterminable relative threshold value $U_{off}$. In fact for edge recognition it is quite sufficient if, given a sufficient rise rate, the predeterminable threshold value is exceeded. Using this second charge and discharge circuit 26 it is accordingly possible to substantially reduce the respective recovery times.

Figure 3:
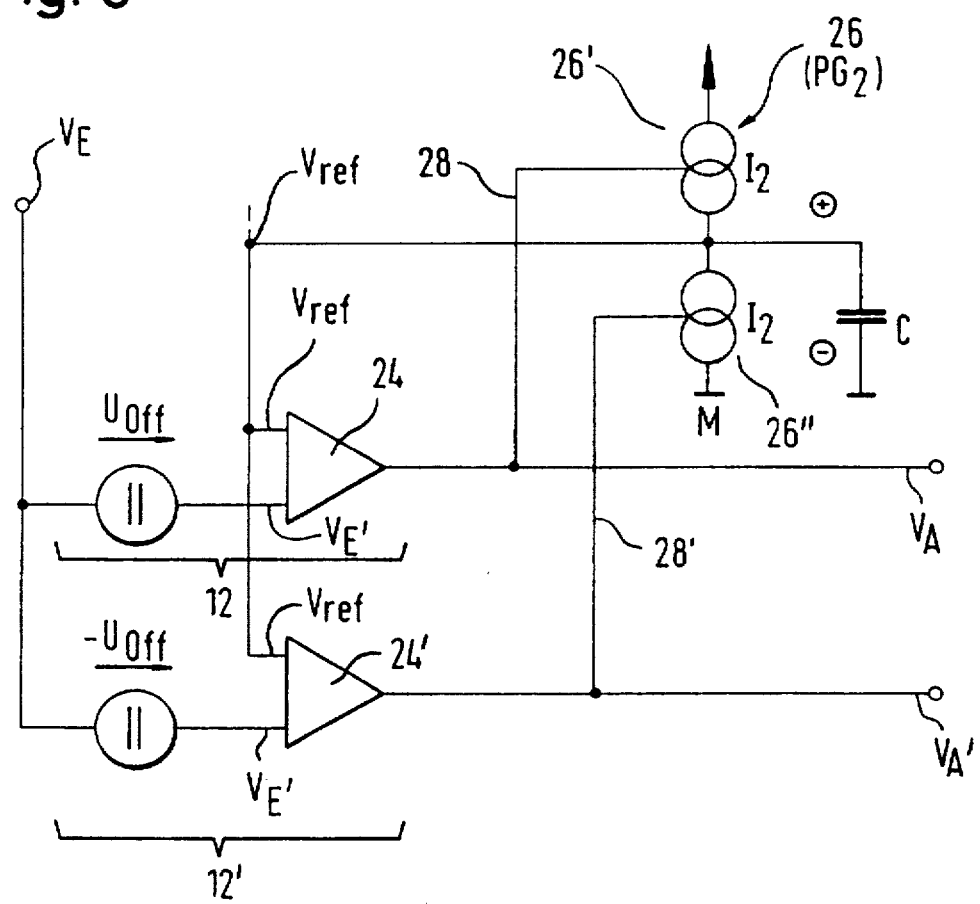
FIG. 3 shows a diagram of a part of third embodiment of an edge detector.

FIG. 3 shows a portion of a third embodiment of an edge detector, which differs from the two preceding embodiments because two comparison circuits 12 and 12' are provided in order to supply output signals $V_A$ and $V_A'$ indicative of the occurrence of a positive and, respectively, negative edge, when the input voltage level $V_E$ changes in a positive or, respectively, negative direction by at least the predeterminable relative threshold value $U_{off}$ in relation to the reference voltage level $V_{ref}$. For this purpose the direct voltage sources employed possess a different polarity ($U_{off}$ and $-U_{off}$).

In this case as well there is again a second current source pair 26' and 26". The current sources thereof possess separate control inputs 28 and 28', which receive the output signal $V_A$ of the one comparatively circuit 12 and, respectively, the output signal $V_A'$ of the other comparison circuit 12'.

In other respects this design possesses the same structure as the two previously described embodiments so that the manner of operation is similar.

The comparators 18, 24 and 24' may conveniently each comprise a differential amplifier. The delay means 14 preferably comprises an analog low pass filter.

We claim:

1. An edge detector for producing output signals in dependence on positive and/or negative edges of an input signal, characterized by a control circuit (10), by which a reference signal level ($V_{ref}$) available at a storage element (C) may be continuously assimilated at a predeterminable first level change rate ($PG_1$) to the input voltage level ($V_E$), by at least one comparison circuit (12, 12'), which supplies an output signal ($V_A$, $V_A'$) indicative of the occurrence of an edge, when the input voltage level ($V_E$) changes by at least a predeterminable relative threshold value ($U_{off}$) in relation to the reference voltage level ($V_{ref}$) and by a delay means (14) comprised in the control circuit (10), whose delay time ($\Delta t_D$) causing a delay in the assimilation of the reference voltage level is selected to be equal to the ratio of the predeterminable relative threshold value ($U_{off}$) to the predeterminable first level change rate ($PG_1$).

2. The edge detector as claimed in claim 1, characterized in that the control circuit (10) comprising the delay means (14) and the storage element (C) furthermore includes a first charge and discharge circuit (16) associated with the storage element (C) and a first comparator (18), whose one input receives the input voltage level ($V_E$) and whose other input receives the reference voltage level ($V_{ref}$) and in that the output of the first comparator (18) is connected via the delay means (14) with a control input (20) of the first charge and discharge circuit (16).

3. The edge detector as claimed in claim 1, characterized in that the storage element includes a capacitor (C).

4. The edge detector as claimed in claim 3, characterized in that the first charge and discharge circuit (16) comprises a first current source pair (16', 16") in order to produce a first charge and discharge current ($I_1$), whose value together with the capacitance of the capacitor (C) sets the predeterminable first level change rate ($PG_1$).

5. The edge detector as claimed in claim 1, characterized in that a second comparator (24, 24') contained in the comparison circuit (12, 12') is provided, whose one input is connected with a voltage level ($V_E'$), which is equal to the input voltage level ($V_E$) reduced by the predeterminable relative threshold value ($U_{off}$) and whose other input receives the reference voltage level ($V_{ref}$) and in that the output signal ($V_A$, $V_A'$) indicative of the occurrence of a respective edge, of the comparison circuit (12, 12') is produced by the second comparator (24, 24').

6. The edge detector as claimed in claim 1, characterized in that a second charge and discharge circuit (26) is associated with the storage element (C), such second charge and discharge circuit (26) having a control input (28, 28'), which is acted upon by the output signal ($V_A$, $V_A'$) of the comparison circuit (12, 12') in order to assimilate the reference voltage level ($V_{ref}$) available at the storage (C) in a manner dependent on the occurrence of the output signal ($V_A$, $V_A'$) to the input voltage level ($V_E$) reduced by the predeterminable relative threshold value ($U_{off}$) and in that the predeterminable second level change rate ($PG_2$) is larger than the first one ($PG_1$).

7. The edge detector as claimed in claim 6, characterized in that the second charge and discharge circuit (26) includes a second current source pair (26', 26") in order to produce a second charge and discharge current ($I_2$) whose value together with the capacitance of the capacitor (C) sets the predeterminable second level change rate ($PG_2$).

8. The edge detector as claimed in claim 1, characterized in that two comparison circuits (12, 12') are provided in order to supply output signals ($V_A$, $V_A'$) indicative of the occurrence of a positive or, respectively, negative edge, when the input voltage level ($V_E$) changes in a positive or, respectively, negative direction by at least the predeterminable relative threshold value ($U_{off}$) in relation to the reference voltage level ($V_{ref}$).

9. The edge detector as claimed in claim 7, characterized in that the current sources of the second current source pair (26', 26") possess separate control inputs (28, 28'), which are acted upon by the output signal ($V_A$) of the one or, respectively, by the output signal ($V_A'$) of the other one of the two comparison circuits (12, 12').

10. The edge detector as claimed in claim 1, characterized in that the two current sources of each current source pair (16', 16"; 26', 26") are driven oppositely.

11. The edge detector as claimed in claim 1, characterized in that the comparators (18, 24, 24') are respectively constituted by a differential amplifier.

* * * * *